United States Patent
Zaima

(10) Patent No.: US 12,376,300 B2
(45) Date of Patent: Jul. 29, 2025

(54) METHOD FOR MANUFACTURING SEMICONDUCTOR DEVICE AND METHOD FOR PROCESSING FILM

(71) Applicant: Kioxia Corporation, Tokyo (JP)

(72) Inventor: Kazunori Zaima, Mie (JP)

(73) Assignee: KIOXIA CORPORATION, Tokyo (JP)

( * ) Notice: Subject to any disclaimer, the term of this patent is extended or adjusted under 35 U.S.C. 154(b) by 531 days.

(21) Appl. No.: 17/687,166

(22) Filed: Mar. 4, 2022

(65) Prior Publication Data

US 2023/0097622 A1    Mar. 30, 2023

(30) Foreign Application Priority Data

Sep. 17, 2021    (JP) ................................ 2021-152311

(51) Int. Cl.
| | | |
|---|---|---|
| H01L 21/311 | (2006.01) | |
| H01L 21/3213 | (2006.01) | |
| H10B 43/27 | (2023.01) | |

(52) U.S. Cl.
CPC ....... H10B 43/27 (2023.02); H01L 21/32133 (2013.01)

(58) Field of Classification Search
CPC .......................... H10B 43/27; H01L 21/32133
See application file for complete search history.

(56) References Cited

U.S. PATENT DOCUMENTS

| | | | |
|---|---|---|---|
| 7,622,394 B2 | 11/2009 | Ikegami | |
| 8,574,447 B2 | 11/2013 | Aso et al. | |
| 9,384,992 B2 | 7/2016 | Narishige et al. | |
| 9,875,929 B1* | 1/2018 | Shukla | H01L 29/40117 |
| 2023/0051815 A1* | 2/2023 | Chen | H01L 29/40117 |
| 2023/0088149 A1* | 3/2023 | Shen | H10B 41/20 |
| | | | 438/269 |
| 2023/0118976 A1* | 4/2023 | Weng | H10B 41/27 |
| | | | 257/314 |
| 2023/0157016 A1* | 5/2023 | Liao | H10B 41/40 |
| | | | 257/314 |
| 2023/0240070 A1* | 7/2023 | Funayama | H10B 43/27 |

FOREIGN PATENT DOCUMENTS

JP    2020-145404 A    9/2020

* cited by examiner

*Primary Examiner* — Dale E Page
*Assistant Examiner* — Colleen E Snow
(74) *Attorney, Agent, or Firm* — Foley & Lardner LLP

(57) ABSTRACT

A method for manufacturing a semiconductor device includes forming a first film on a substrate, forming a second film on the first film, and forming a second recessed portion in the second film. The method further includes forming a third film on a side surface of the second film in the second recessed portion, and processing the second or third film in the second recessed portion. The method further includes processing the first film from the second recessed portion to form a first recessed portion in the first film, after processing the second or third film.

21 Claims, 15 Drawing Sheets

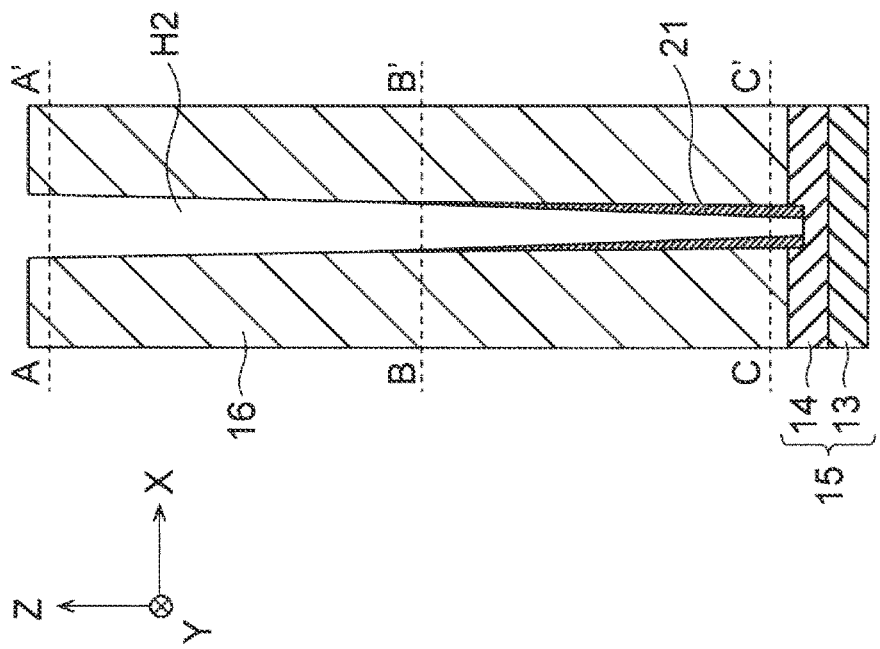
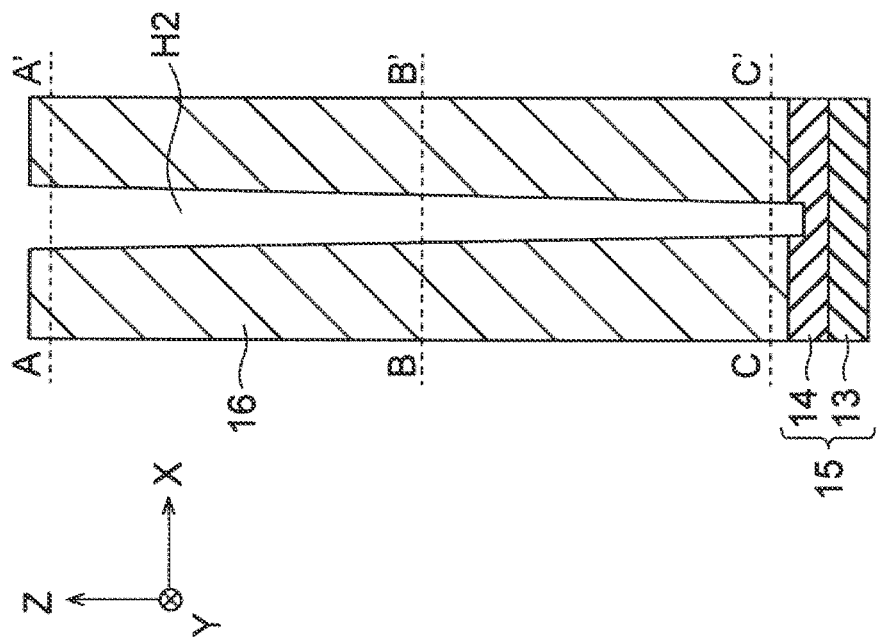

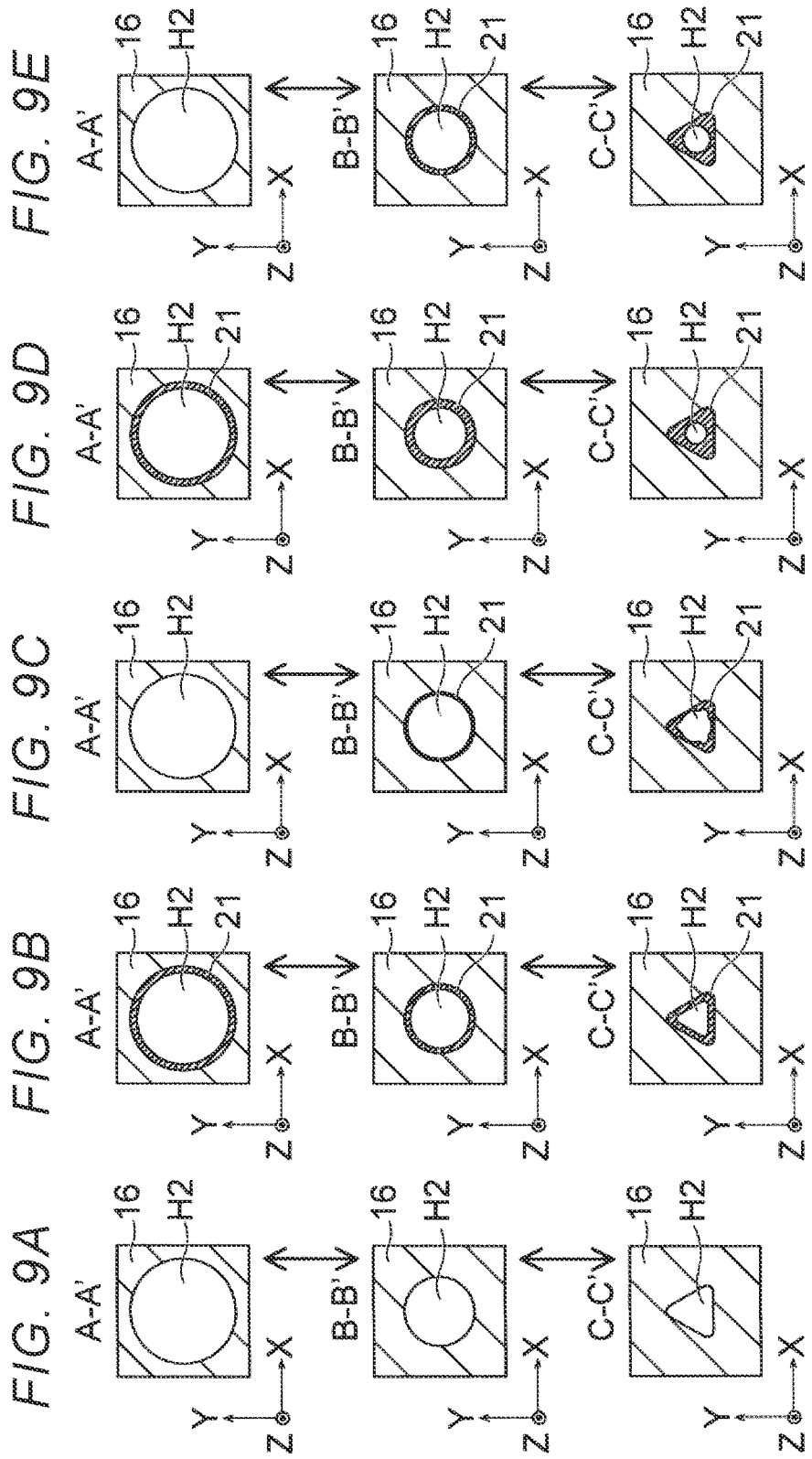

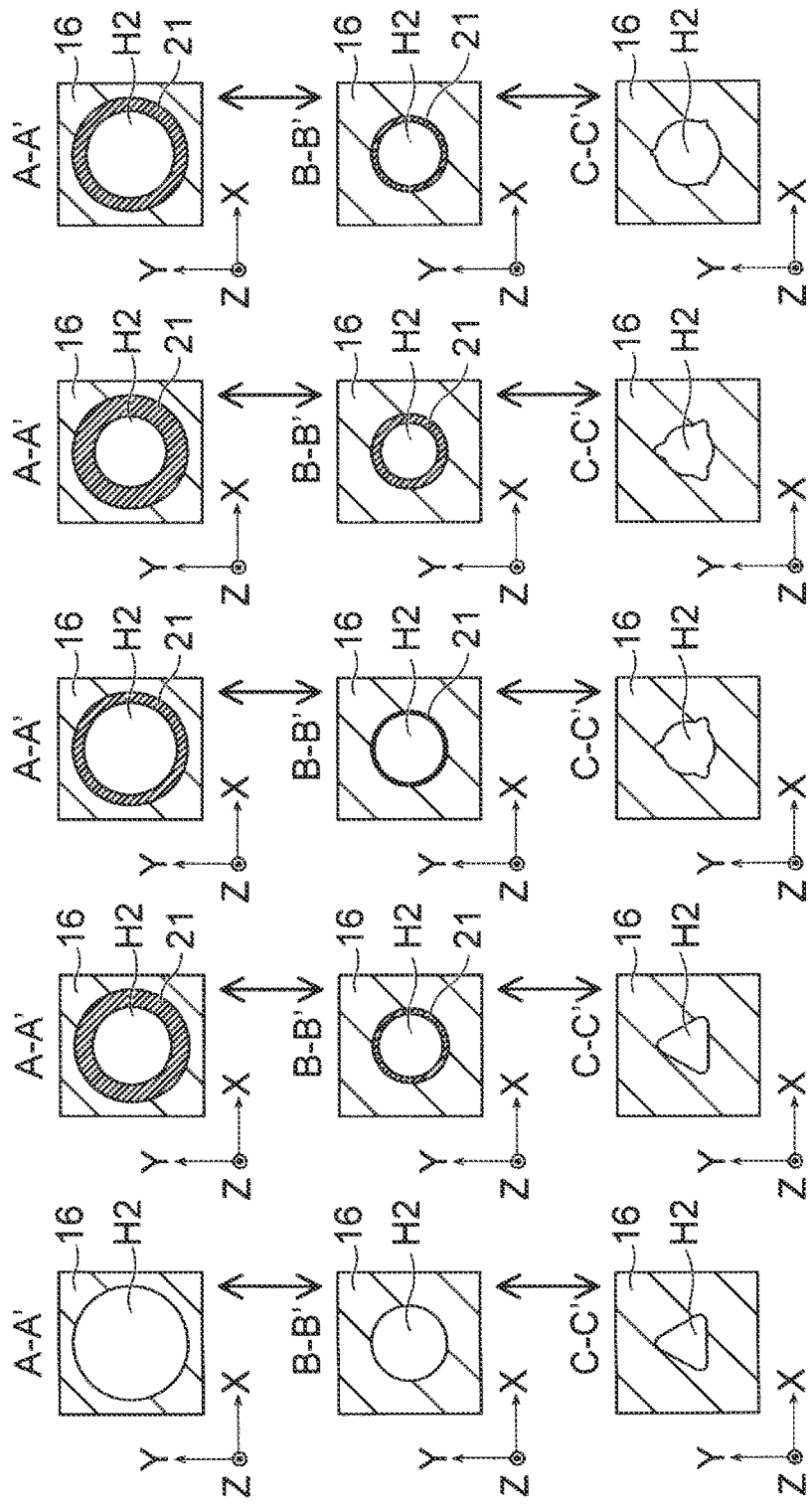

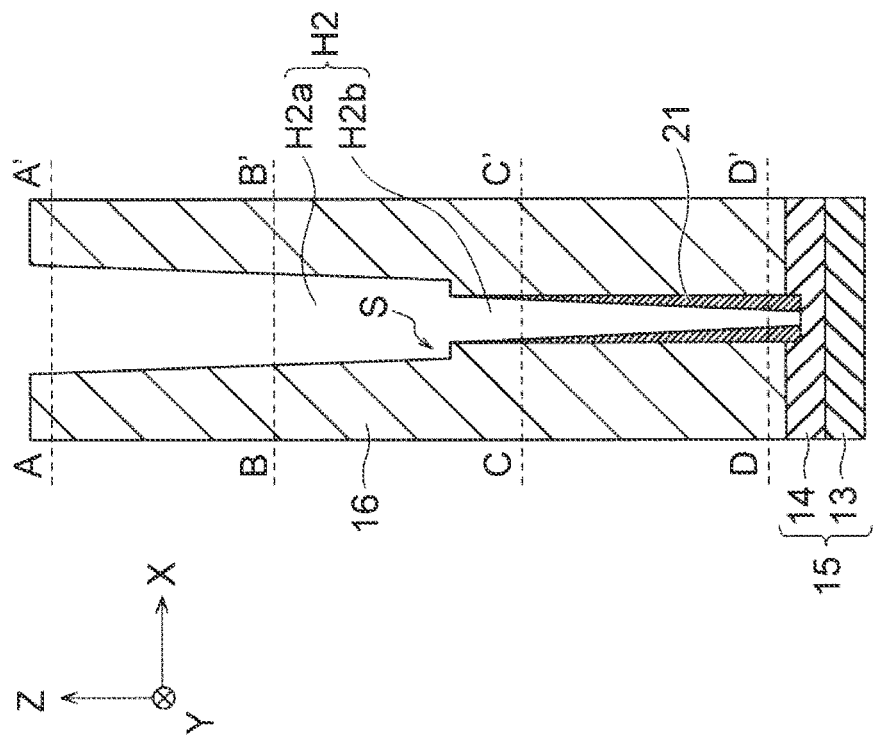
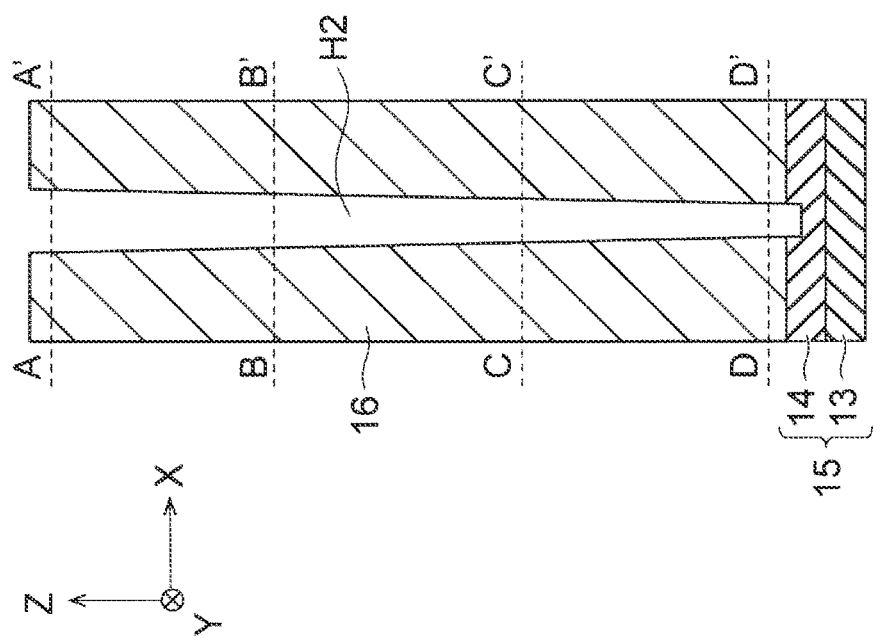

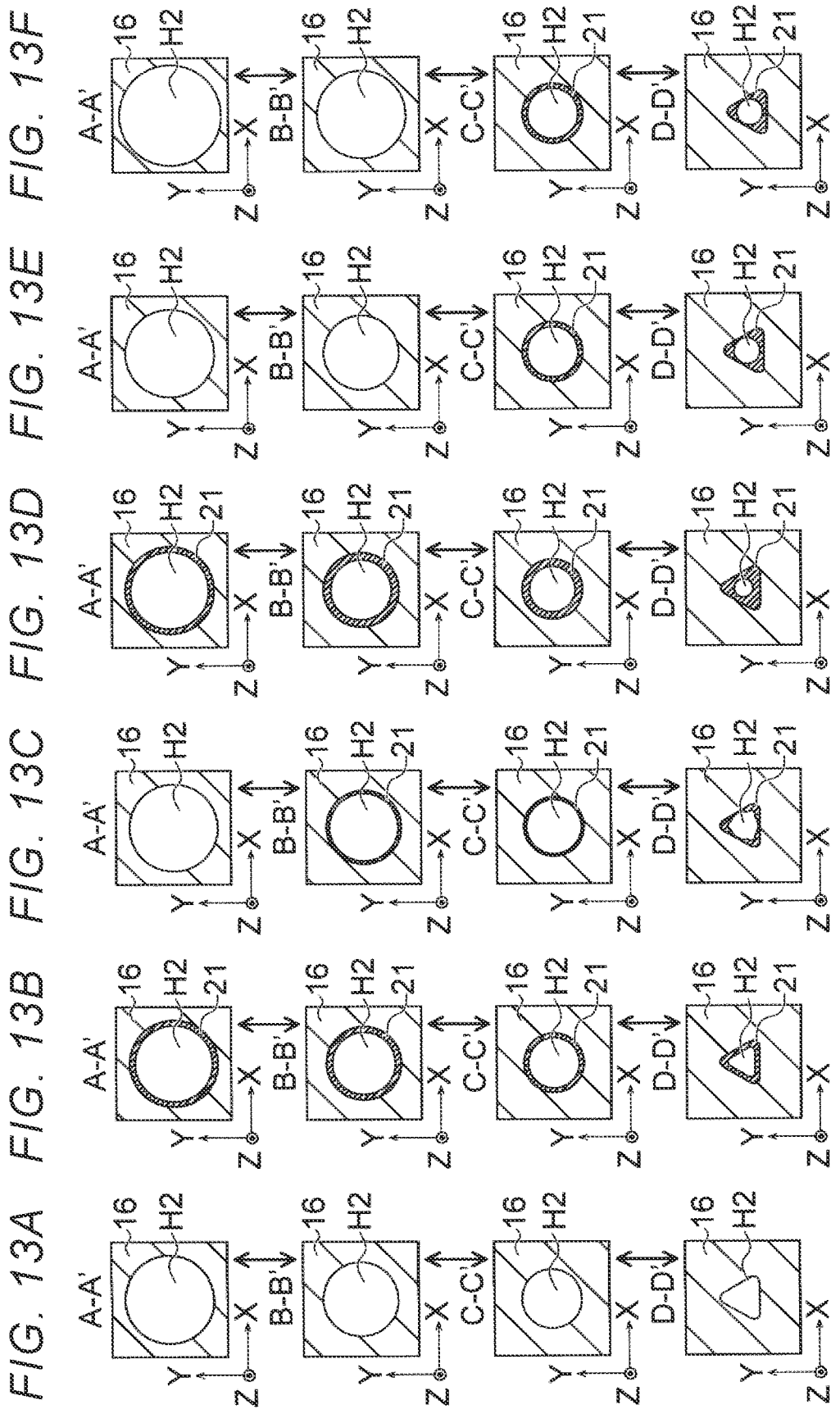

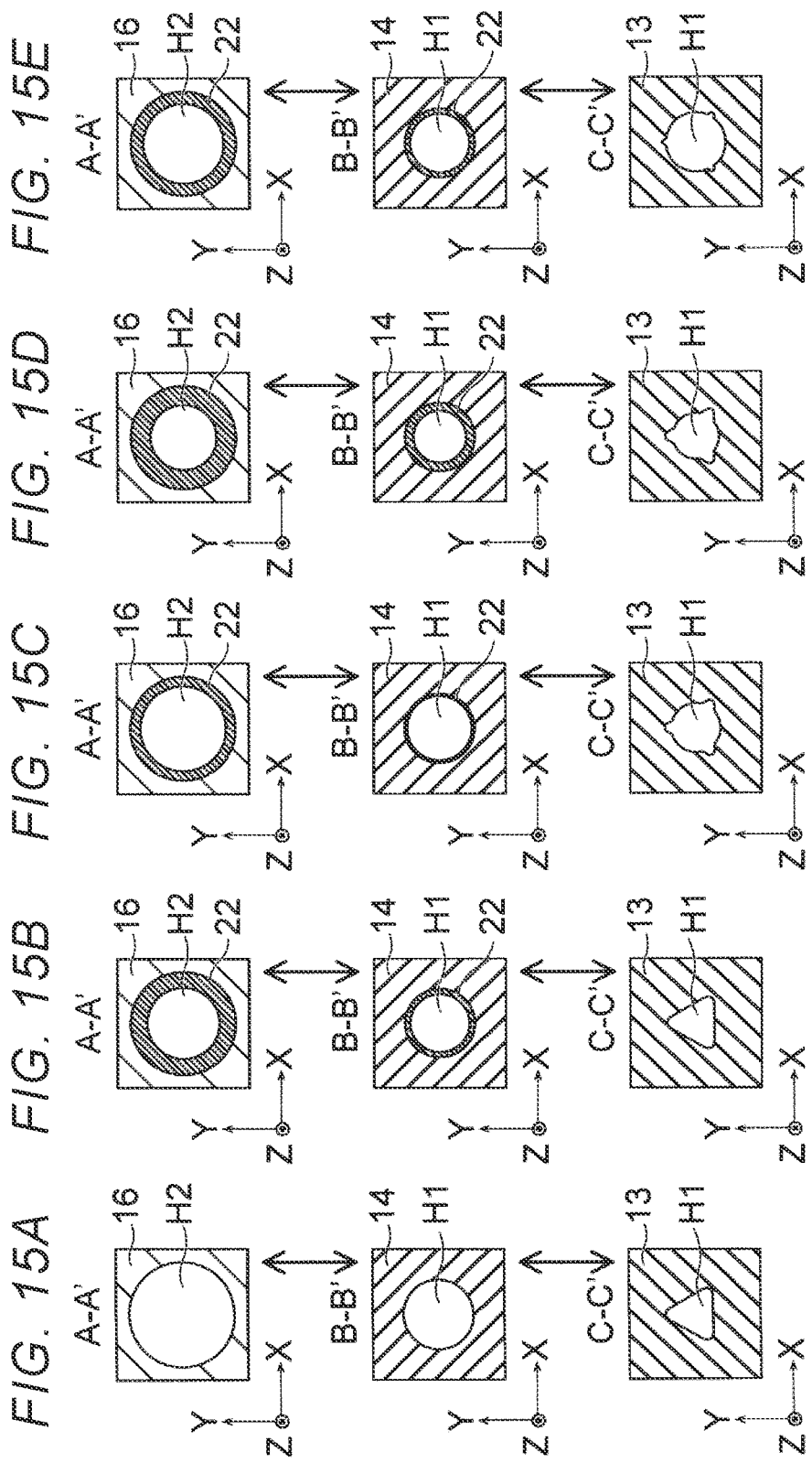

METHOD FOR MANUFACTURING SEMICONDUCTOR DEVICE AND METHOD FOR PROCESSING FILM

CROSS-REFERENCE TO RELATED APPLICATION

This application is based upon and claims the benefit of priority from Japanese Patent Application No. 2021-152311, filed Sep. 17, 2021, the entire contents of which are incorporated herein by reference.

FIELD

Embodiments described herein relate generally to a method for manufacturing a semiconductor device and a method for processing a film.

BACKGROUND

When a recessed portion, such as a hole in a film, is formed in the substrate, it may be difficult to control a shape of the recessed portion to a desired shape.

DESCRIPTION OF THE DRAWINGS

FIGS. 8A and 8B are vertical cross-sectional views showing details of the method for manufacturing a semiconductor device according to the first embodiment.

FIGS. 9A to 9E are cross-sectional views showing details of the method for manufacturing a semiconductor device according to the first embodiment.

FIGS. 11A to 11E are cross-sectional views showing the method for manufacturing a semiconductor device according to the second embodiment.

FIGS. 12A and 12B are vertical cross-sectional views showing a method for manufacturing a semiconductor device according to a third embodiment.

FIGS. 13A to 13F are cross-sectional views showing the method for manufacturing a semiconductor device according to the third embodiment.

FIGS. 15A to 15E are cross-sectional views showing the method for manufacturing a semiconductor device according to the fourth embodiment.

DETAILED DESCRIPTION

Figure 1:
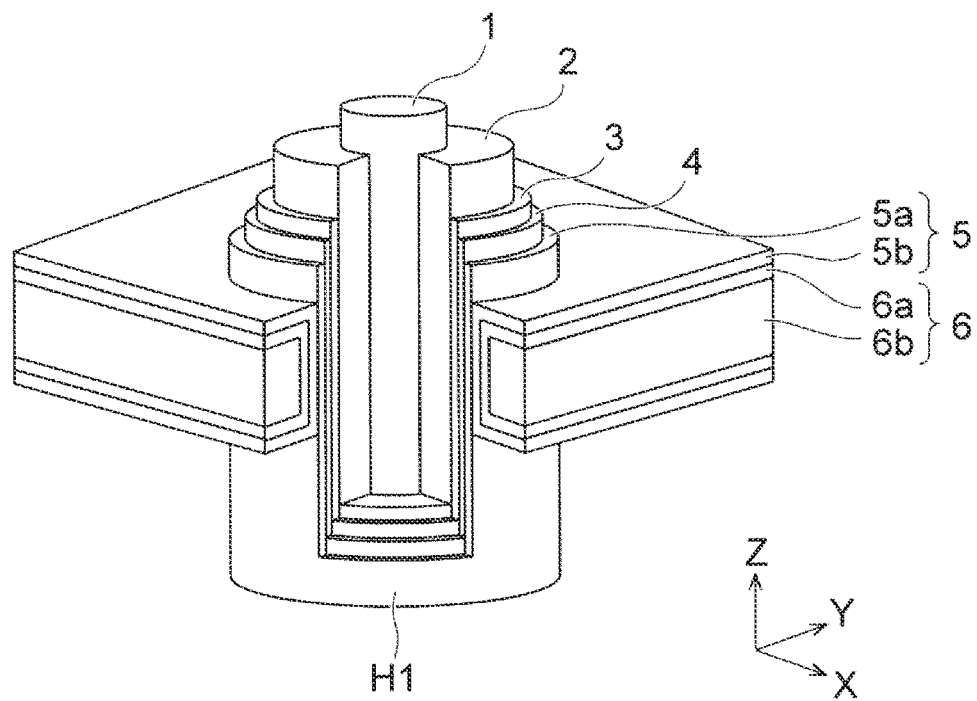
FIG. 1 is a perspective view showing a structure of a semiconductor device according to a first embodiment.

Embodiments provide a method for manufacturing a semiconductor device and a method for processing a film, which can form a recessed portion having a desired shape in the film.

In general, according to at least one embodiment, a method for manufacturing a semiconductor device includes forming a first film on a substrate, forming a second film on the first film, and forming a second recessed portion in the second film. The method further includes forming a third film on a side surface of the second film in the second recessed portion, and processing the second or third film in the second recessed portion. The method further includes processing the first film from the second recessed portion to form a first recessed portion in the first film, after processing the second or third film.

Hereinafter, embodiments of the present disclosure will be described with reference to the drawings. In FIGS. 1 to 15, the same components are designated by the same reference numerals, and the detailed description thereof will be omitted.

First Embodiment

FIG. 1 is a perspective view showing a structure of a semiconductor device according to a first embodiment. The semiconductor device in FIG. 1 is, for example, a three-dimensional NAND memory.

In FIG. 1, the semiconductor device includes a core insulating film 1, a channel semiconductor layer 2, a tunnel insulating film 3, a charge storage layer 4, a block insulating film 5, and an electrode layer 6. The block insulating film 5 includes an insulating film 5$a$ and an insulating film 5$b$. The electrode layer 6 includes a barrier metal layer 6$a$ and an electrode material layer 6$b$.

In FIG. 1, a plurality of electrode layers and a plurality of insulating layers are alternately stacked on a substrate, and a memory hole H1 is provided in the electrode layers and the insulating layers. FIG. 1 shows one of the electrode layers, the electrode layer 6. The electrode layers function as, for example, a word line of the NAND memory. FIG. 1 shows X and Y directions parallel to a surface of the substrate and perpendicular to each other, and a Z direction perpendicular to the surface of the substrate. In the present specification, a +Z direction is regarded as an upward direction, and a −Z direction is regarded as a downward direction. The −Z direction may or may not coincide with a gravity direction.

The core insulating film 1, the channel semiconductor layer 2, the tunnel insulating film 3, the charge storage layer 4, and the insulating film 5$a$ are formed in the memory hole H1 and form a memory cell of the NAND memory. The insulating film 5$a$ is formed on surfaces of the electrode layer and the insulating layer in the memory hole H1, and the charge storage layer 4 is formed on a surface of the insulating film 5$a$. The charge storage layer 4 can store charges between an outer side surface and an inner side surface. The tunnel insulating film 3 is formed on a surface of the charge storage layer 4, and the channel semiconductor layer 2 is formed on a surface of the tunnel insulating film 3. The channel semiconductor layer 2 functions as a channel of the memory cell. The core insulating film 1 is formed in the channel semiconductor layer 2.

The insulating film 5a is, for example, a silicon oxide (SiO$_2$) film. The charge storage layer 4 is, for example, a silicon nitride (SiN) film. The tunnel insulating film 3 is, for example, a stacked film including a silicon oxynitride (SiON) film and a SiO$_2$ film. The channel semiconductor layer 2 is, for example, a polysilicon layer. The core insulating film 1 is, for example, a SiO$_2$ film.

The insulating film 5b, the barrier metal layer 6a, and the electrode material layer 6b are formed between insulating layers adjacent to each other, and sequentially formed on a lower surface of the upper insulating layer, an upper surface of the lower insulating layer, and a side surface of the insulating film 5a. The insulating film 5b is, for example, a metal insulating film such as an aluminum oxide (Al$_2$O$_3$) film. The barrier metal layer 6a is, for example, a titanium nitride (TiN) film. The electrode material layer 6b is, for example, a tungsten (W) layer.

FIGS. 2 to 7 are vertical cross-sectional views showing the method for manufacturing a semiconductor device according to the first embodiment.

Figure 2:
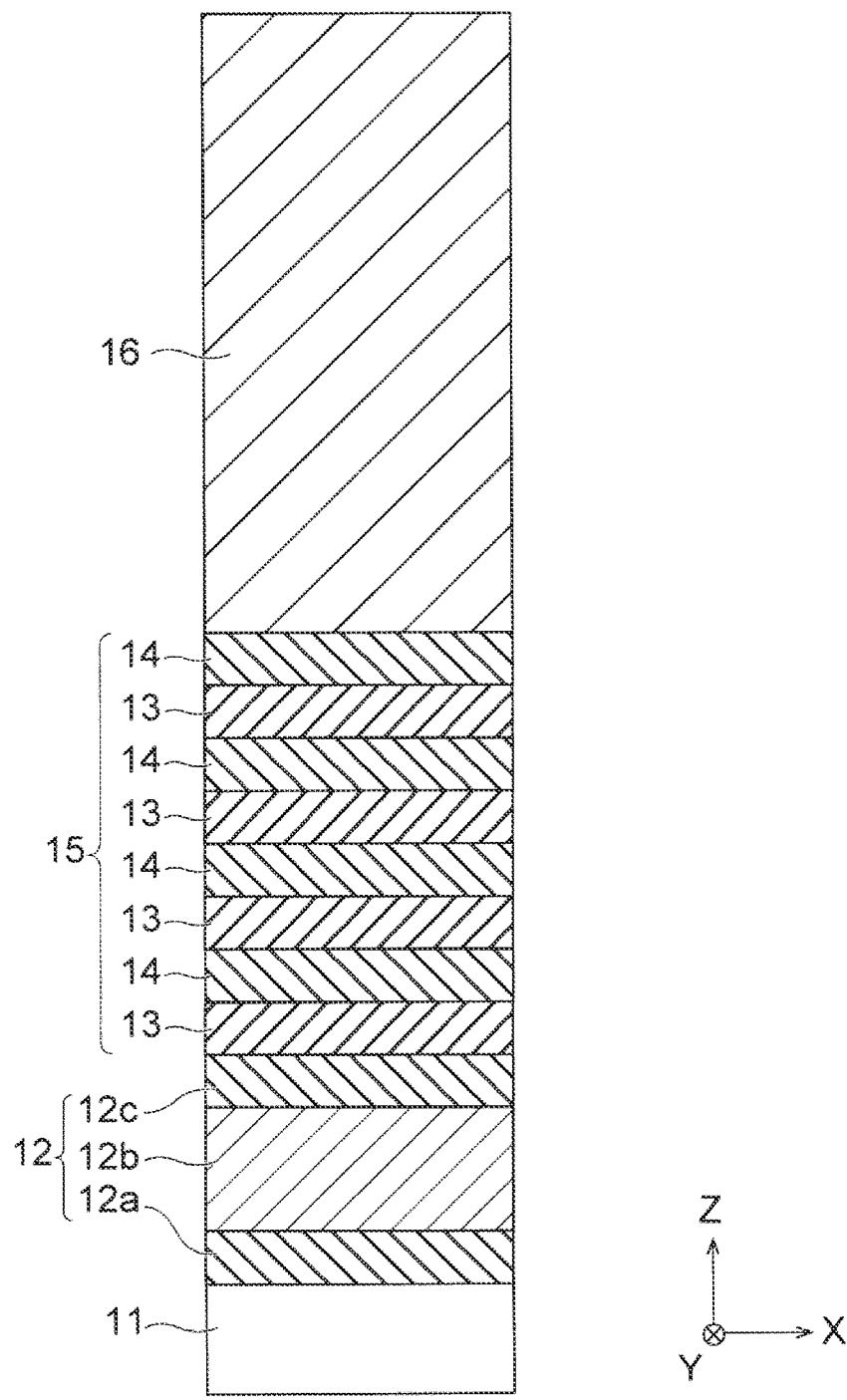
FIG. 2 is a vertical cross-sectional view (1/6) showing a method for manufacturing a semiconductor device according to the first embodiment.

First, a base film 12 is formed on a substrate 11, and a plurality of sacrificial layers 13 and a plurality of insulating layers 14 are alternately formed on the base film 12 (FIG. 2). As a result, a stacked film 15 that alternately includes the plurality of sacrificial layers 13 and the plurality of insulating layers 14 is formed on the base film 12. Next, a hard mask film 16 is formed on the substrate 11 (FIG. 2). The base film 12 and the stacked film 15 are examples of a first film, and the hard mask film 16 is an example of a second film. The sacrificial layer 13 is an example of a first layer, and the insulating layer 14 is an example of a second layer.

The substrate 11 is, for example, a semiconductor substrate such as a silicon (Si) substrate. The base film 12 is, for example, a stacked film including a lower insulating film 12a, a semiconductor layer 12b, and an upper insulating film 12c which are sequentially provided on the substrate 11. The lower insulating film 12a is, for example, a stacked film including a SiO$_2$ film, or a SiO$_2$ film and other insulating films. The semiconductor layer 12b is, for example, a polysilicon layer. The upper insulating film 12c is, for example, a stacked film including a SiO$_2$ film, or a SiO$_2$ film and other insulating films. The sacrificial layer 13 is, for example, a SiN film. The insulating layer 14 is, for example, a SiO$_2$ film. The hard mask film 16 is, for example, a carbon-containing film containing carbon (C), and in at least one embodiment, is a carbon film formed by chemical vapor deposition (CVD).

Figure 3:
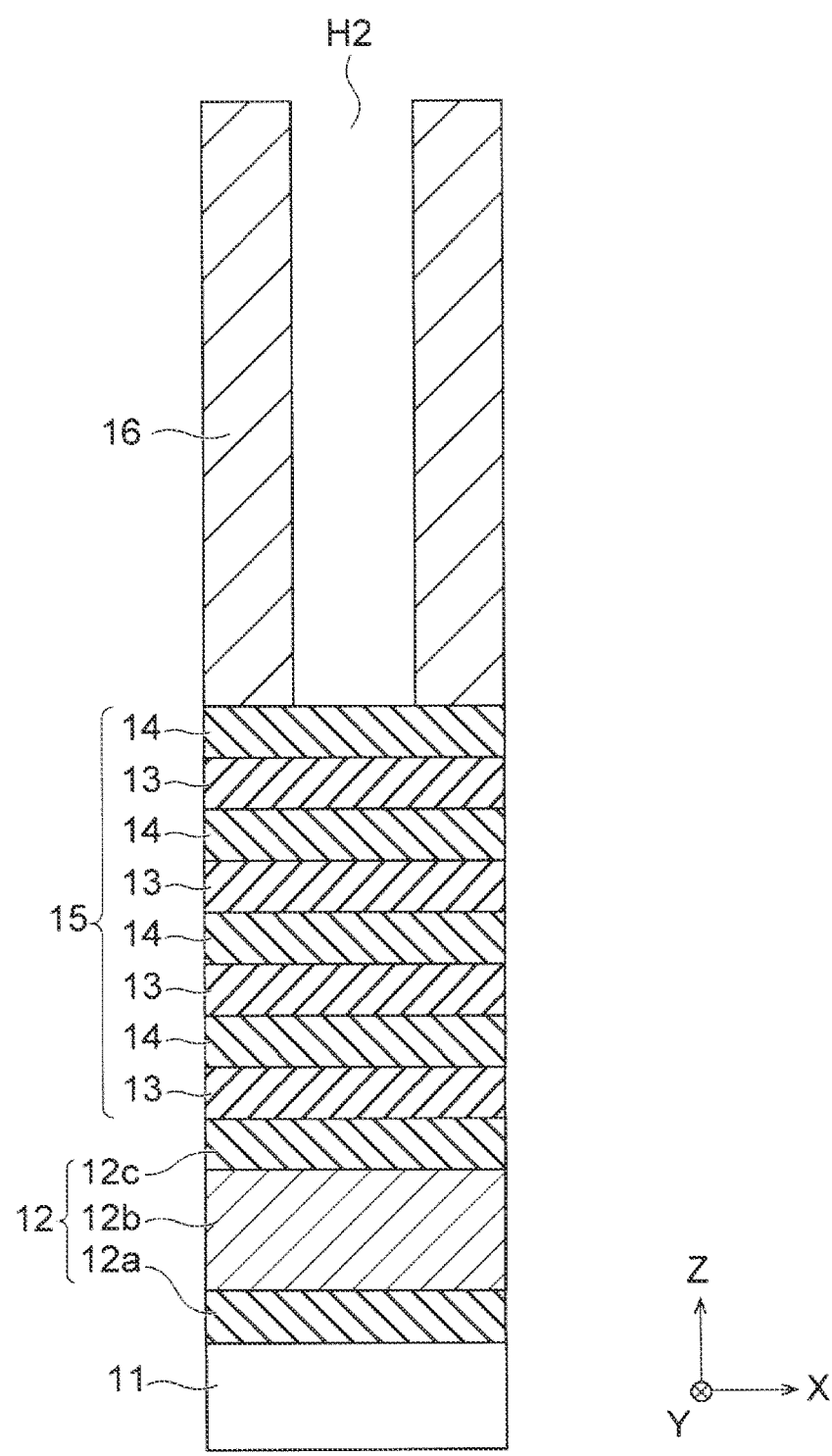
FIG. 3 is a vertical cross-sectional view (2/6) showing the method for manufacturing a semiconductor device according to the first embodiment.

Next, a hole H2 is formed in the hard mask film 16 by lithography and etching (FIG. 3). As a result, the hole H2 penetrates the hard mask film 16, an upper surface of the stacked film 15 is exposed in the hole H2. The hole H2 is an example of the second recessed portion. More details of the process shown in FIG. 3 will be described later.

Figure 4:
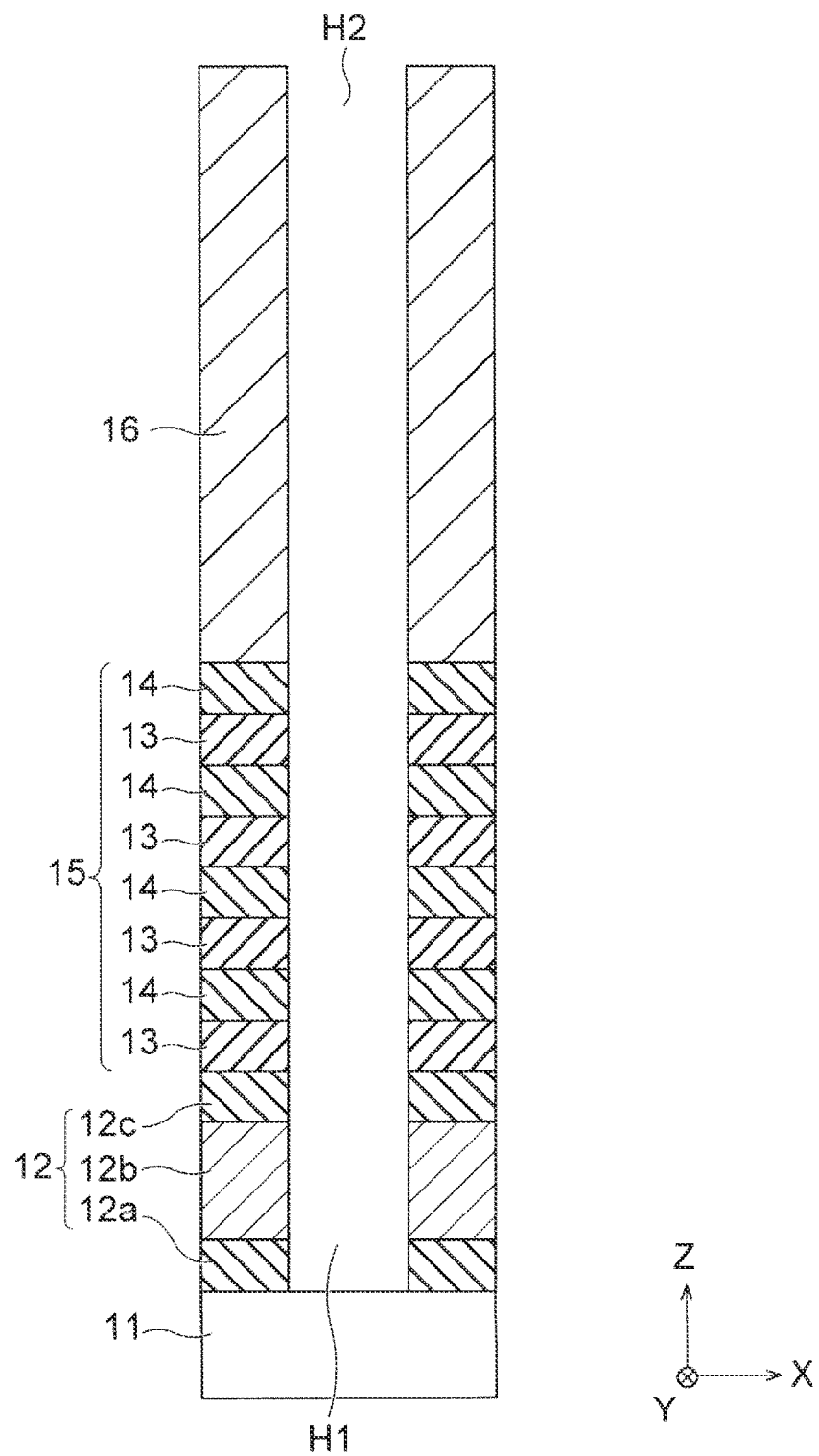
FIG. 4 is a vertical cross-sectional view (3/6) showing the method for manufacturing a semiconductor device according to the first embodiment.

Next, the stacked film 15 and the base film 12 are processed from the hole H2 by etching using the hard mask film 16 as a mask (FIG. 4). As a result, the hole H2 is transferred to the stacked film 15 and the base film 12, so that the memory hole H1 is formed in the stacked film 15 and the base film 12. In at least one embodiment, the memory hole H1 penetrates the stacked film 15 and the base film 12, and an upper surface of the substrate 11 is exposed in the memory hole H1. The memory hole H1 may reach the semiconductor layer above the substrate 11 instead of reaching the substrate 11. The memory hole H1 is an example of the first recessed portion.

Figure 5:
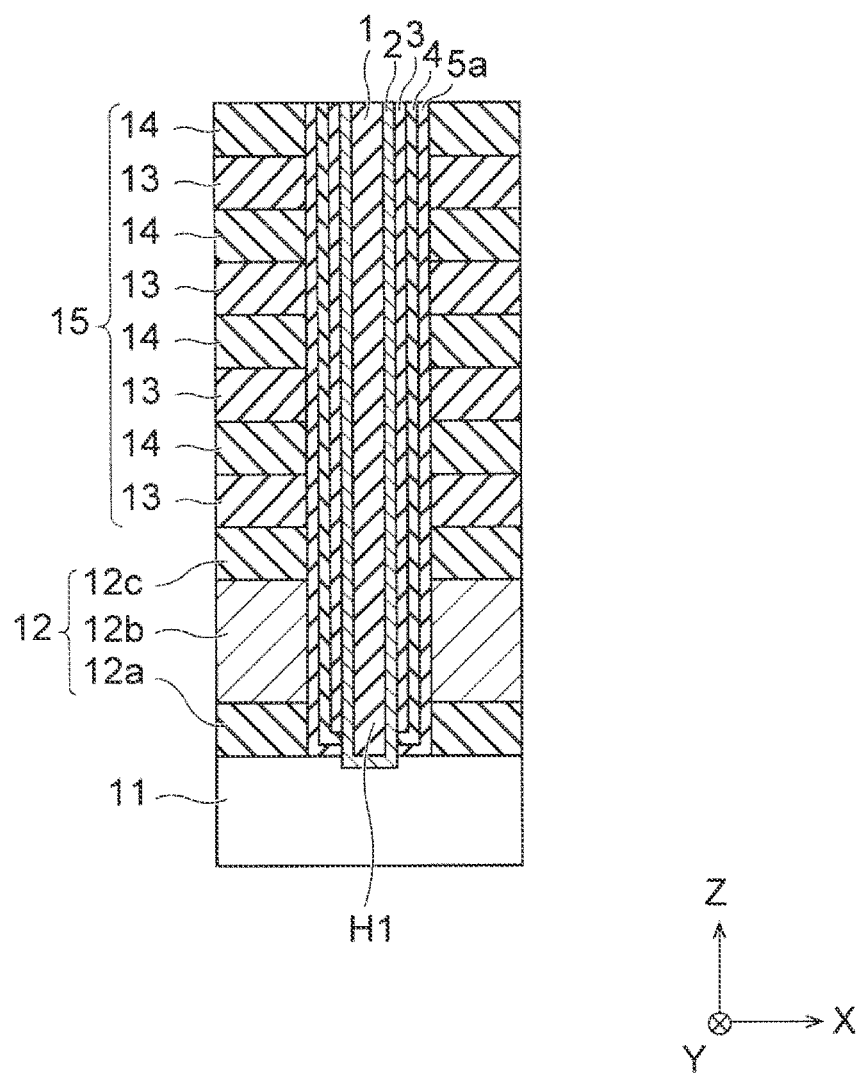
FIG. 5 is a vertical cross-sectional view (4/6) showing the method for manufacturing a semiconductor device according to the first embodiment.

Next, the hard mask film 16 is removed, and the insulating film 5a, the charge storage layer 4, and the tunnel insulating film 3 are sequentially formed on the surfaces of the substrate 11, the base film 12, and the stacked film 15 in the memory hole H1 (FIG. 5). Next, the insulating film 5a, the charge storage layer 4, and the tunnel insulating film 3 are removed from a bottom of the memory hole H1 by etching (FIG. 5). As a result, the upper surface of the substrate 11 is exposed again in the memory hole H1. Next, the channel semiconductor layer 2 and the core insulating film 1 are sequentially formed on the surfaces of the substrate 11 and the tunnel insulating film 3 in the memory hole H1 (FIG. 5). As a result, the insulating film 5a, the charge storage layer 4, the tunnel insulating film 3, the channel semiconductor layer 2, and the core insulating film 1 are sequentially formed on side surfaces of the base film 12 and the stacked film 15 in the memory hole H1.

Figure 6:
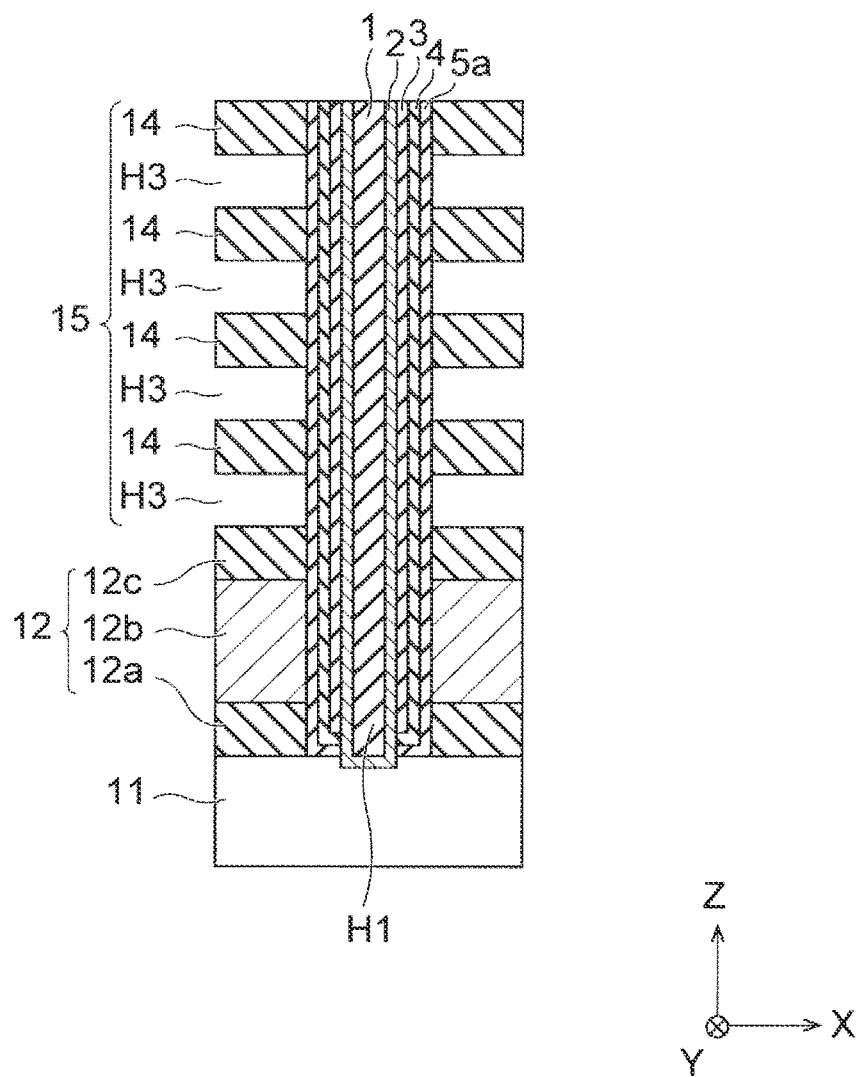
FIG. 6 is a vertical cross-sectional view (5/6) showing the method for manufacturing a semiconductor device according to the first embodiment.

Next, a slit (not shown) is formed in the stacked film 15, and the sacrificial layer 13 is removed with a chemical solution such as phosphoric acid by using the slit. As a result, a plurality of cavities H3 are formed between the insulating layers 14 (FIG. 6).

Figure 7:
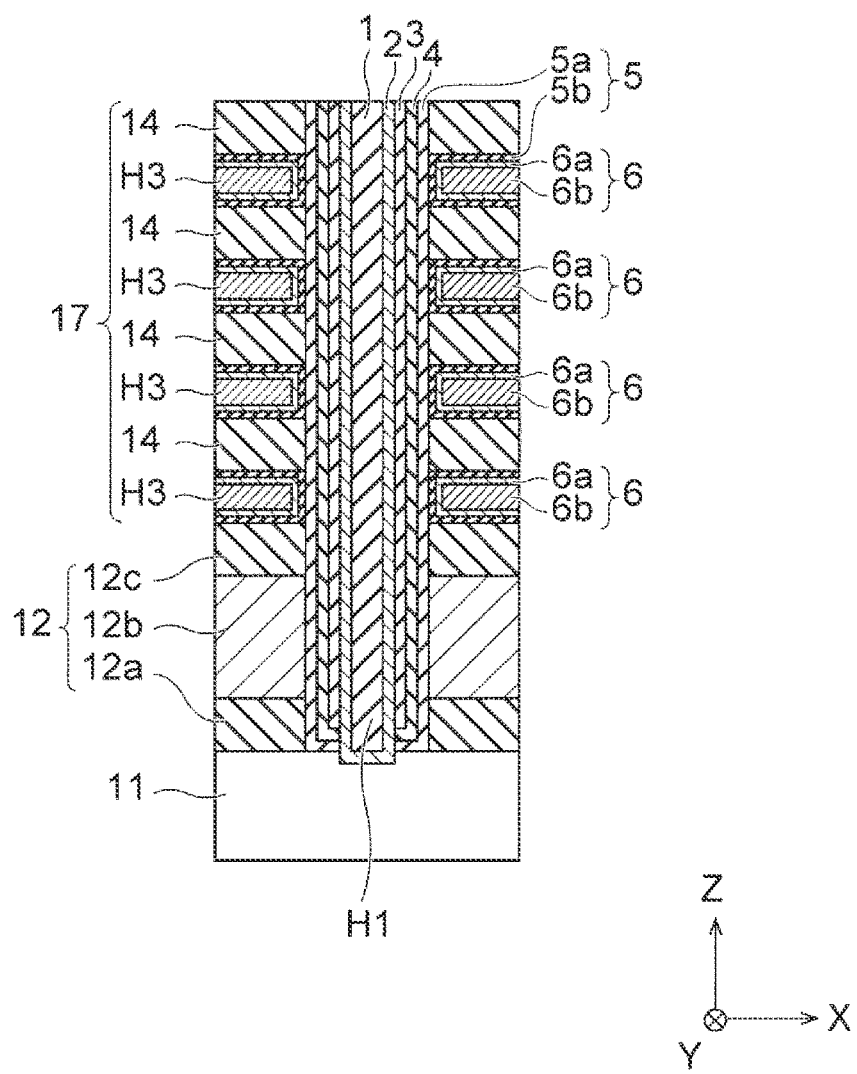
FIG. 7 is a vertical cross-sectional view (6/6) showing the method for manufacturing a semiconductor device according to the first embodiment.

Next, the insulating film 5b, the barrier metal layer 6a, and the electrode material layer 6b are sequentially formed on the surfaces of the insulating layer 14 and the insulating film 5a in the cavity H3 (FIG. 7). As a result, the block insulating film 5 including the insulating film 5a and the insulating film 5b is formed. Furthermore, the electrode layer 6 including the barrier metal layer 6a and the electrode material layer 6b is formed in each cavity H3. Furthermore, a stacked film 17 that alternately includes the plurality of electrode layers 6 and the plurality of insulating layers 14 is formed on the base film 12.

By doing so, a semiconductor device of at least one embodiment is manufactured (FIG. 7). FIG. 1 shows a part of the semiconductor device shown in FIG. 7.

FIGS. 8A and 8B are vertical cross-sectional views showing details of the method for manufacturing a semiconductor device according to the first embodiment.

FIGS. 8A and 8B show details of a step (FIG. 3) of forming the hole H2 in the hard mask film 16. In this step, first, the hole H2 is formed in the hard mask film 16 by lithography and anisotropic etching (FIG. 8A). The anisotropic etching is, for example, reactive ion etching (RIE). Next, one or more deposition treatments for forming a spacer film 21 in the hole H2 by CVD, and one or more processing treatments for processing the hard mask film 16 and the spacer film 21 in the hole H2 by isotropic etching are alternately performed. As a result, it is possible to correct a shape of the hole H2 to a desired shape (FIG. 8B). The isotropic etching is, for example, wet etching, chemical dry etching. The spacer film 21 contains, for example, silicon, and is an amorphous silicon film (a-Si film) formed by CVD in at least one embodiment. The CVD may be, for example, low pressure chemical vapor deposition (LPCVD) or atomic layer deposition (ALD). The spacer film 21 is an example of a third film or a fourth film.

An XY cross-sectional shape of the hole H2 in the present embodiment is a true circle, which is desirable. The true circle here means a circle with high roundness, and includes, for example, a strict circle or a circle close to a strict circle. The step shown in FIG. 8B is performed, for example, in order to make the XY cross-sectional shape of the hole H2 close to the true circle. In FIG. 8B, the spacer film 21 is formed on a side surface of the hard mask film 16 in the vicinity of a lower end of the hole H2, and is not formed on the side surface of the hard mask film 16 in the vicinity of an upper end of the hole H2. Therefore, the side surface of the hole H2 in the vicinity of the lower end of the hole H2 is a side surface of the spacer film 21, and the side surface of the hole H2 in the vicinity of the upper end of the hole H2 is the side surface of the hard mask film 16. In addition, a tapered angle of the side surface of the hole H2 shown in FIG. 8B is greater than a tapered angle of the side surface of the hole H2 shown in FIG. 8A.

FIGS. 9A to 9E are cross-sectional views showing details of the method for manufacturing a semiconductor device according to the first embodiment.

FIGS. 9A to 9E show details of a step (FIG. 3) of forming the hole H2 in the hard mask film 16, as in FIGS. 8A and 8B. FIG. 9A shows an XY cross section taken along the lines A-A', B-B', and C-C' shown in FIG. 8A or FIG. 8B. On the side surface of the hard mask film 16 in the hole H2, a portion on the line A-A' is an example of a first portion, and a portion on the line B-B' or a portion on the line C-C' is an example of a second portion located below the first portion. The same applies to FIGS. 9B to 9E.

FIG. 9A shows a step of forming the hole H2 in the hard mask film 16 by lithography and anisotropic etching, as in FIG. 8A. A cross-sectional shape of the side surface of the hard mask film 16 on the line A-A' or the line B-B' is a true circle. On the other hand, the cross-sectional shape of the side surface of the hard mask film 16 on the line C-C' is not a true circle, but specifically a triangle. The reason why such a phenomenon occurs is that the hole H2 has a high aspect ratio, and thus ions and the like that contribute to the etching hardly reach the vicinity of the lower end of the hole H2.

The hole H2 of at least one embodiment is used to form the memory hole H1, as described with reference to FIG. 4. If the memory hole H1 is formed by using the hole H2 shown in FIG. 9A, the cross-sectional shape of the side surface of the memory hole H1 may not be a true circle. The reason is that the cross-sectional shape of the memory hole H1 is easily affected by the cross-sectional shape of the hole H2 in the vicinity of the lower end of the hole H2. Therefore, in at least one embodiment, the cross-sectional shape of the hole H2 is corrected by the steps shown in FIGS. 9B to 9E.

FIGS. 9B, 9C, 9D, and 9E show a first deposition treatment, a first processing treatment, a second deposition treatment, and a second processing treatment, respectively. The cross-sectional shape of the hole H2 in at least one embodiment is corrected by alternately performing two deposition treatments and two or more processing treatments. The number of times of performing the deposition treatment may be other than two. Similarly, the number of times of performing the processing treatment may be other than two.

FIG. 9B shows the first deposition treatment for forming the spacer film 21 in the hole H2 by the CVD. The CVD is performed, for example, under a condition that the spacer film 21 is conformally formed on the side surface and the lower surface of the hole H2. Thus, a thickness of the spacer film 21 shown in FIG. 9B is substantially the same in the A-A' cross section, the B-B' cross section, and the C-C' cross section.

FIG. 9C shows the first processing treatment for processing the hard mask film 16 and the spacer film 21 in the hole H2 by the isotropic etching. The isotropic etching is performed, for example, under a condition that an etching selection ratio of the spacer film 21 to the hard mask film 16 is greater than 1. When an etching rate of the hard mask film 16 is represented by R1 and an etching rate of the spacer film 21 is represented by R2, a relationship "R2/R1>1" is satisfied in FIG. 9C.

The isotropic etching is, for example, wet etching using ammonia, choline, or tetramethylammonium hydroxide (TMAH). In the present embodiment, a chemical solution obtained by mixing a 4% choline aqueous solution and ultrapure water at a ratio of 1:40 at 70° C. is used for the isotropic etching. In this case, R1 is less than 0.05 nm/sec, and R2 is 1.0 nm/sec. A temperature during the mixing is not too high, which is desirable.

In the general isotropic etching, the etching rate of a projection portion on the side surface of the hole H2 is higher than the etching rate of a recessed portion in the side surface of the hole H2. Therefore, the spacer film 21 is completely removed from the A-A' cross section shown in FIG. 9C, and as a result, the side surface of the hard mask film 16 is exposed. Furthermore, the spacer film 21 remains in the B-B' cross section or the C-C' cross section shown in FIG. 9C. Furthermore, in the C-C' cross section shown in FIG. 9C, the shape of the side surface of the spacer film 21 is close to a true circle by the isotropic etching.

FIG. 9D shows the second deposition treatment for forming the spacer film 21 in the hole H2 by the CVD. The CVD is performed, for example, under a condition that the spacer film 21 is conformally formed on the side surface and the lower surface of the hole H2. However, the thickness of the spacer film 21 shown in FIG. 9D increases sequentially from the A-A' cross section, the B-B' cross section, and the C-C' cross section. This is because the spacer film 21 shown in FIG. 9D includes the spacer film 21 formed in the first deposition treatment and the spacer film 21 formed in the second deposition treatment.

FIG. 9E shows the second processing treatment for processing the hard mask film 16 and the spacer film 21 in the hole H2 by the isotropic etching. The isotropic etching is performed, for example, under a condition that an etching selection ratio of the spacer film 21 to the hard mask film 16 is greater than 1.

In at least one embodiment, this condition is set to be the same as the condition in the first processing treatment. Therefore, the spacer film 21 is completely removed from the A-A' cross section shown in FIG. 9E, and as a result, the side surface of the hard mask film 16 is exposed. Furthermore, the spacer film 21 remains in the B-B' cross section or the C-C' cross section shown in FIG. 9E. Furthermore, in the C-C' cross section shown in FIG. 9E, the shape of the side surface of the spacer film 21 is close to a further true circle by the isotropic etching.

By doing so, the spacer film 21 having the shape shown in FIG. 8B is formed. In at least one embodiment, the steps shown in FIGS. 4 to 7 are then performed. As a result, it is possible to make the cross-sectional shape of the side surface of the memory hole H1 close to the true circle. As such, a semiconductor device of at least one embodiment is manufactured.

Generally, an etching rate when the memory hole H1 is formed increases as a hole diameter in the vicinity of the upper end of the hole H2 increases, and the hole diameter of the memory hole H1 increases as the hole diameter in the vicinity of the lower end of the hole H2 increases. According to at least one embodiment, the hole diameter in the vicinity of the upper end of the hole H2 can be increased, whereby the etching rate when the memory hole H1 is formed can be increased. Further, according to at least one embodiment, the hole diameter in the vicinity of the lower end of the hole H2 can be reduced. As a result, the hole diameter of the memory hole H1 can be reduced, thereby improving an integration degree of a memory cell.

As described above, when manufacturing the semiconductor device in at least one embodiment, the deposition treatment for forming the spacer film 21 in the hole H2 and the processing treatment for processing the hard mask film 16 and the spacer film 21 in the hole H2 are performed, and the memory hole H1 is then formed. Thus, according to at least one embodiment, it is possible to form the hole H2 having a desired shape, and it is possible to form the memory hole H1 having a desired shape by using the hole H2.

The hole H2 may be used to form a hole other than the memory hole H1. Such a hole may be used, for example, to form a contact plug, a via plug, a capacitor, a transistor, and the like in the hole. In addition, a film formed with the hole H2 may be other than a carbon film. Examples of such a film are a Si film, a $SiO_2$ film, a stacked film that alternately includes a $SiO_2$ film and a SiN film, or the like. In addition, the hard mask film 16 and the spacer film 21 may be formed by a method other than the CVD. The above descriptions may be also applied to the second to fourth embodiments which will be described later.

Second Embodiment

Figure 10A:
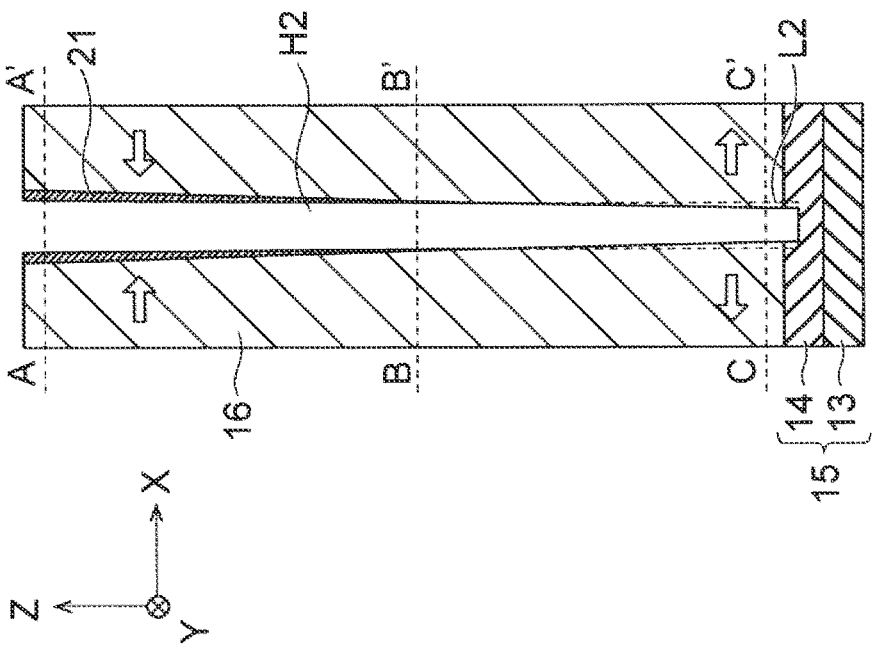
FIGS. 10A and 10B are vertical cross-sectional views showing a method for manufacturing a semiconductor device according to a second embodiment.
Figure 10B:
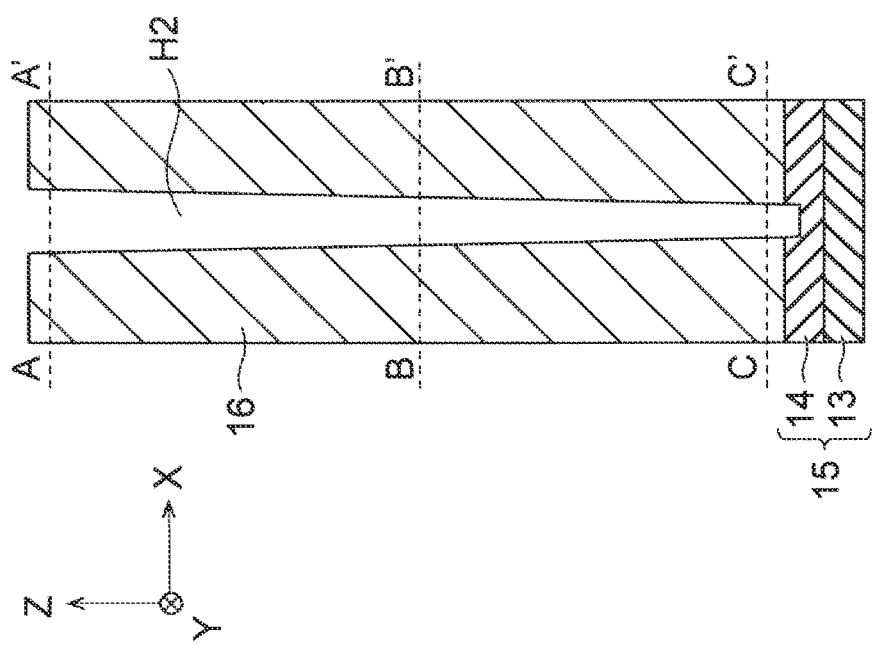

FIGS. 10A and 10B are vertical cross-sectional views showing a method for manufacturing a semiconductor device according to a second embodiment.

FIGS. 10A and 10B show details of a step (FIG. 3) of forming the hole H2 in the hard mask film 16, as in FIGS. 8A and 8B. First, the hole H2 is formed in the hard mask film 16 by lithography and anisotropic etching (FIG. 10A). Next, one or more deposition treatments for forming a spacer film 21 in the hole H2 by the CVD, and one or more processing treatments for processing the hard mask film 16 and the spacer film 21 in the hole H2 by isotropic etching are alternately performed. As a result, it is possible to correct a shape of the hole H2 to a desired shape (FIG. 10B).

An XY cross-sectional shape of the hole H2 in at least one embodiment is also a true circle, which is desirable. The step shown in FIG. 10B is performed, for example, in order to make the XY cross-sectional shape of the hole H2 close to the true circle. In FIG. 10B, the spacer film 21 is formed on a side surface of the hard mask film 16 in the vicinity of the upper end of the hole H2, and is not formed on the side surface of the hard mask film 16 in the vicinity of the lower end of the hole H2. Therefore, the side surface of the hole H2 in the vicinity of the upper end of the hole H2 is a side surface of the spacer film 21, and the side surface of the hole H2 in the vicinity of the lower end of the hole H2 is the side surface of the hard mask film 16. In addition, a tapered angle of the side surface of the hole H2 shown in FIG. 10B is smaller than a tapered angle of the side surface of the hole H2 shown in FIG. 10A. An arrow shown in FIG. 10B indicates a direction in which a position of the side surface of the hole H2 moves.

FIGS. 11A to 11E are cross-sectional views showing the method for manufacturing a semiconductor device according to the second embodiment.

FIGS. 11A to 11E show details of a step (FIG. 3) of forming the hole H2 in the hard mask film 16, as in FIGS. 10A and 10B. FIG. 11A shows an XY cross section taken along the lines A-A', B-B', and C-C' shown in FIG. 10A or FIG. 10B. The same applies to FIGS. 11B to 11E.

FIG. 11A shows a step of forming the hole H2 in the hard mask film 16 by lithography and anisotropic etching, as in FIG. 10A. A cross-sectional shape of the side surface of the hard mask film 16 on the line A-A' or the line B-B' is a true circle. On the other hand, the cross-sectional shape of the side surface of the hard mask film 16 on the line C-C' is not a true circle, but specifically a triangle. In at least one embodiment, the cross-sectional shape of the hole H2 is corrected by the steps shown in FIGS. 11B to 11E.

FIGS. 11B, 11C, 11D, and 11E show a first deposition treatment, a first processing treatment, a second deposition treatment, and a second processing treatment, respectively. The cross-sectional shape of the hole H2 in at least one embodiment is corrected by alternately performing two deposition treatments and two or more processing treatments.

FIG. 11B shows the first deposition treatment for forming the spacer film 21 in the hole H2 by CVD. The CVD is performed, for example, under a condition that the spacer film 21 is nonconformally formed on the side surface and the lower surface of the hole H2. Thus, the spacer film 21 shown in FIG. 11B is thickly formed in the A-A' cross section, thinly formed in the B-B' cross section, and not formed in the C-C' cross section.

FIG. 11C shows the first processing treatment for processing the hard mask film 16 and the spacer film 21 in the hole H2 by the isotropic etching. The isotropic etching is performed, for example, under a condition that an etching selection ratio of the hard mask film 16 to the spacer film 21 is greater than 1. When an etching rate of the hard mask film 16 is represented by R1 and an etching rate of the spacer film 21 is represented by R2, a relationship "R1/R2>1" is satisfied in FIG. 11C.

The isotropic etching is, for example, etching by chemical dry etching using an oxygen ($O_2$) gas diluted with a nitrogen ($N_2$) gas. The etching by chemical dry etching in the present embodiment is performed by using an MW plasma device under conditions of 600 mT, a $N_2$ flow rate of 950 sccm, an $O_2$ flow rate of 250 sccm, 1250 W, 200° C. In this case, R1 is 1.1 nm/sec, and R2 is less than 0.05 nm/sec. The gas used in the etching by chemical dry etching may be an $O_2$ gas, an ammonia ($NH_3$) gas, a hydrogen ($H_2$) gas, or a water ($H_2O$) gas.

When the relationship of "R1/R2>1" is satisfied, the etching is easily advanced in the vicinity of the lower end of the hole H2, and the etching is hardly advanced in the vicinity of the upper end of the hole H2. Therefore, the spacer film 21 remains, while being thinned, in the A-A' cross section and the B-B' cross section shown in FIG. 11C. On the other hand, in the C-C' cross section shown in FIG. 11C, the shape of the side surface of the hard mask film 16 is close to a true circle by the isotropic etching.

FIG. 11D shows the second deposition treatment for forming the spacer film 21 in the hole H2 by CVD. The CVD is performed, for example, under a condition that the spacer film 21 is nonconformally formed on the side surface and the lower surface of the hole H2. The spacer film 21 shown in FIG. 11D includes the spacer film 21 formed in the first deposition treatment and the spacer film 21 formed in the second deposition treatment.

FIG. 11E shows the second processing treatment for processing the hard mask film 16 and the spacer film 21 in the hole H2 by the isotropic etching. The isotropic etching is performed, for example, under a condition that an etching selection ratio of the hard mask film 16 to the spacer film 21 is greater than 1.

In at least one embodiment, this condition is set to be the same as the condition in the first processing treatment. Therefore, the spacer film 21 remains, while being thinned, in the A-A' cross section and the B-B' cross section shown in FIG. 11E. On the other hand, in the C-C' cross section shown in FIG. 11E, the shape of the side surface of the hard mask film 16 is closer to a true circle by the isotropic etching.

By doing so, the spacer film 21 having the shape shown in FIG. 10B is formed. In at least one embodiment, the steps shown in FIGS. 4 to 7 are then performed. As a result, it is possible to make the cross-sectional shape of the side surface of the memory hole H1 close to the true circle. As such, a semiconductor device of at least one embodiment is manufactured.

Generally, when the hole diameter of the upper end of the hole H2 is greater than the hole diameter of the lower end of the hole H2, bowing easily occurs on the side surface of the memory hole H1. According to at least one embodiment, the hole diameter in the vicinity of the upper end of the hole H2 can be reduced, whereby the hole diameter in the vicinity of the lower end of the hole H2 can be increased. As a result, the change in hole diameter between the upper end and the lower end of the hole H2 can be reduced, thereby preventing an occurrence of the bowing.

According to at least one embodiment, as in the first embodiment, it is possible to form the hole H2 having a desired shape and form the memory hole H1 having a desired shape by using the hole H2.

Third Embodiment

FIGS. 12A and 12B are vertical cross-sectional views showing a method for manufacturing a semiconductor device according to a third embodiment.

FIGS. 12A and 12B show details of a step (FIG. 3) of forming the hole H2 in the hard mask film 16, as in FIGS. 8A and 8B. First, the hole H2 is formed in the hard mask film 16 by lithography and anisotropic etching (FIG. 12A). Next, one or more deposition treatments for forming a spacer film 21 in the hole H2 by CVD, and one or more processing treatments for processing the hard mask film 16 and the spacer film 21 in the hole H2 by isotropic etching are alternately performed, and furthermore, an additional processing treatment is performed. In the additional processing treatment, the hard mask film 16 and the spacer film 21 in the hole H2 are processed by the isotropic etching. As a result, it is possible to correct a shape of the hole H2 to a desired shape (FIG. 12B).

An XY cross-sectional shape of the hole H2 in the present embodiment is also a true circle, which is desirable. The step shown in FIG. 12B is performed, for example, in order to make the XY cross-sectional shape of the hole H2 close to the true circle. In FIG. 12B, the spacer film 21 is formed on a side surface of the hard mask film 16 in the vicinity of the lower end of the hole H2, and is not formed on the side surface of the hard mask film 16 in the vicinity of the upper end of the hole H2. Therefore, the side surface of the hole H2 in the vicinity of the lower end of the hole H2 is a side surface of the spacer film 21, and the side surface of the hole H2 in the vicinity of the upper end of the hole H2 is the side surface of the hard mask film 16. In addition, in the hole H2 shown in FIG. 12B, a step S is formed on the side surface of the hard mask film 16. The step S of at least one embodiment is formed in a ring shape on the side surface of the hard mask film 16.

FIGS. 13A to 13F are cross-sectional views showing the method for manufacturing a semiconductor device according to the third embodiment.

FIGS. 13A to 13F show details of a step (FIG. 3) of forming the hole H2 in the hard mask film 16, as in FIGS. 12A and 12B. FIG. 13A shows an XY cross section taken along the lines A-A', B-B', C-C', and D-D' shown in FIG. 12A or FIG. 12B. On the side surface of the hard mask film 16 in the hole H2, a portion on the line A-A' is an example of a first portion, and a portion on the line C-C' or a portion on the line D-D' is an example of a second portion located below the first portion. In addition, a portion of the step S is an example of a third portion located between the first portion and the second portion. The same applies to FIGS. 13B to 13F.

The steps shown in FIGS. 13A to 13E are performed in the same manner as the steps shown in FIGS. 9A to 9E of the first embodiment, respectively. Thus, FIG. 13A shows a step of forming the hole H2 in the hard mask film 16 by lithography and anisotropic etching. In addition, FIGS. 13B, 13C, 13D, and 13E show a first deposition treatment, a first processing treatment, a second deposition treatment, and a second processing treatment, respectively.

In the processing treatments, the isotropic etching is performed, for example, under a condition that an etching selection ratio of the spacer film 21 to the hard mask film 16 is greater than 1. When an etching rate of the hard mask film 16 is represented by R1 and an etching rate of the spacer film 21 is represented by R2, a relationship "R2/R1>1" is satisfied in FIG. 13C or FIG. 13E. In the present embodiment, this condition is set to be the same as the condition in the processing treatment of the first embodiment.

On the other hand, FIG. 13F shows an additional processing treatment. In the additional processing treatments, the isotropic etching is performed, for example, under a condition that an etching selection ratio of the hard mask film 16 to the spacer film 21 is greater than 1. When an etching rate of the hard mask film 16 is represented by R1 and an etching rate of the spacer film 21 is represented by R2, a relationship "R1/R2>1" is satisfied in FIG. 13F. In at least one embodiment, this condition is set to be the same as the condition in the processing treatment of the second embodiment.

In the step shown in FIG. 13F, the side surface of the hole H2 in the vicinity of the upper end of the hole H2 is not the side surface of the spacer film 21, and is the side surface of the hard mask film 16. Therefore, the etching of the side surface of the hard mask film 16 is advanced, and the step S is formed between the side surface of the hard mask film 16 and the side surface of the spacer film 21.

By doing so, the spacer film 21 having the shape shown in FIG. 12B is formed. In at least one embodiment, the steps shown in FIGS. 4 to 7 are then performed. As a result, it is possible to make the cross-sectional shape of the side surface of the memory hole H1 close to the true circle. As such, a semiconductor device of at least one embodiment is manufactured.

According to at least one embodiment, as in the first embodiment and the second embodiment, it is possible to form the hole H2 having a desired shape and form the memory hole H1 having a desired shape by using the hole H2.

Further, according to at least one embodiment, the step S is formed on the side surface of the hard mask film 16, such that it is possible to further increase the hole diameter in the vicinity of the upper end of the hole H2, thereby further increasing the etching rate when the memory hole H1 is formed.

Fourth Embodiment

Figure 14A:
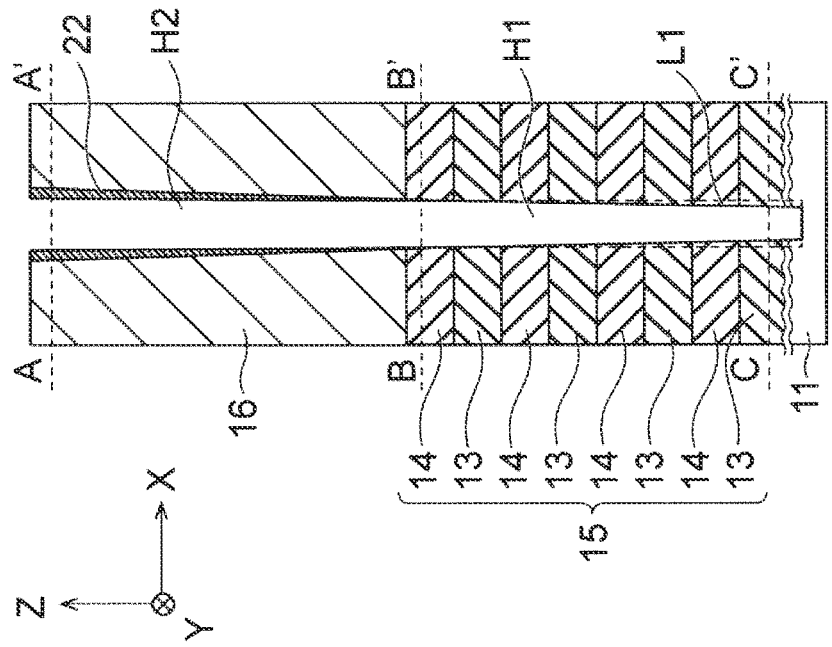
FIGS. 14A and 14B are vertical cross-sectional views showing a method for manufacturing a semiconductor device according to a fourth embodiment.
Figure 14B:
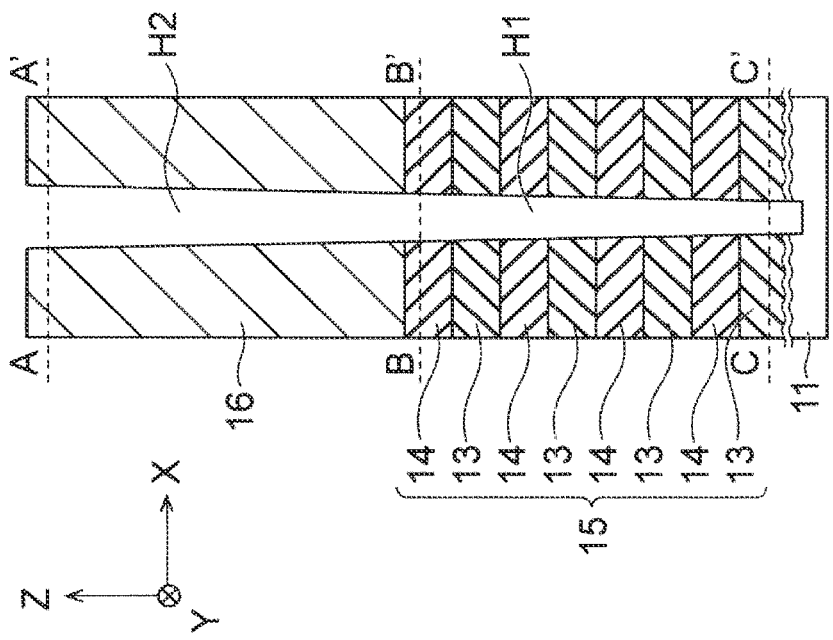

FIGS. 14A and 14B are vertical cross-sectional views showing a method for manufacturing a semiconductor device according to a fourth embodiment.

FIGS. 14A and 14B show details of the step (FIG. 4) of forming the memory hole H1 in the base film 12 and the stacked film 15. In this step, first, the memory hole H1 is formed in the base film 12 and the stacked film 15 by lithography and anisotropic etching (FIG. 14A). The anisotropic etching is, for example, RIE. Next, one or more deposition treatments for forming a spacer film 22 in the memory hole H1 and the hole H2 by CVD, and one or more processing treatments for processing the base film 12, the stacked film 15, the hard mask film 16, and the spacer film 22 in the memory hole H1 and the hole H2 by isotropic etching are alternately performed. As a result, it is possible to correct the shapes of the memory hole H1 and the hole H2 to a desired shape (FIG. 14B). The isotropic etching is, for example, wet etching, chemical dry etching, or etching by chemical dry etching. The spacer film 22 contains, for example, silicon, and is an amorphous silicon film (a-Si film) formed by CVD in at least one embodiment. The spacer film 22 is an example of a third film or a fourth film.

As described above, the spacer film 21 in the first to third embodiments is formed in the hole H2, whereas the spacer film 22 of the present embodiment is formed in the memory hole H1 and the hole H2. The spacer film 22 of at least one embodiment may be formed only in the memory hole H1 of the memory hole H1 and the hole H2, or may be formed only in the hole H2 of the memory hole H1 and the hole H2.

An XY cross-sectional shape of the memory hole H1 in the present embodiment is a true circle, which is desirable. The step shown in FIG. 14B is performed, for example, in order to make the XY cross-sectional shape of the memory hole H1 close to the true circle. In FIG. 14B, the spacer film 22 is formed on a side surface of the hard mask film 16 in the vicinity of the upper end of the hole H2, and is not formed on the side surface of the stacked film 15 or the base film 12 in the vicinity of the lower end of the memory hole H1. Therefore, the side surface of the hole H2 in the vicinity of the upper end of the hole H2 is a side surface of the spacer film 22, and the side surface of the memory hole H1 in the vicinity of the lower end of the memory hole H1 is the side surface of the stacked film 15 or the base film 12. In addition, a tapered angle of the side surface of the memory hole H1 and the hole H2 shown in FIG. 14B is smaller than a tapered angle of the side surface of the memory hole H1 and the hole H2 shown in FIG. 14A.

FIGS. 15A to 15E are cross-sectional views showing the method for manufacturing a semiconductor device according to the fourth embodiment.

FIGS. 15A to 15E show details of a step (FIG. 4) of forming the memory hole H1 in the base film 12 and the stacked film 15, as in FIGS. 14A and 14B. FIG. 15A shows an XY cross section taken along the lines A-A', B-B', and C-C' shown in FIG. 14A or FIG. 14B. The same applies to FIGS. 15B to 15E.

The steps shown in FIGS. 15A to 15E are performed in the same manner as the steps shown in FIGS. 11A to 11E of the second embodiment, respectively. However, the treatment related to the formation of the hole H2 and the treatment related to the processing of the hole H2 in the second embodiment is replaced with the treatment related to the formation of the memory hole H1 and the treatment related to the processing of the memory hole H1 and the hole H2 in the first embodiment. Thus, FIG. 15A shows a step of forming the memory hole H1 in the base film 12 and the stacked film 15 by lithography and anisotropic etching. In addition, FIGS. 15B, 15C, 15D, and 15E show a first deposition treatment, a first processing treatment, a second deposition treatment, and a second processing treatment, respectively.

In the processing treatments, the isotropic etching is performed, for example, under a condition that an etching selection ratio of the hard mask film 16 to the spacer film 22 is greater than 1. When an etching rate of the hard mask film 16 is represented by R1 and an etching rate of the spacer film 22 is represented by R2, a relationship "R1/R2>1" is satisfied in FIG. 15C or FIG. 15E. In the present embodiment, this condition is set to be the same as the condition in the processing treatment of the second embodiment.

By doing so, the spacer film 22 having the shape shown in FIG. 14B is formed. In at least one embodiment, the steps shown in FIGS. 5 to 7 are then performed. As such, a semiconductor device of at least one embodiment is manufactured. The spacer film 22 shown in FIG. 14B remains only on the side surface of the hard mask film 16, but may also remain on the side surface of the stacked film 15 or the base film 12 as long as obstacles are not caused in the operation of the semiconductor device.

According to at least one embodiment, it is possible to form the memory hole H1 having a desired shape as in the first to third embodiments. Further, according to at least one embodiment, the same method as the second embodiment is used, such that it is possible to reduce the change in hole diameter between the upper end and the lower end of the memory hole H1.

While certain embodiments have been described, these embodiments have been presented by way of example only, and are not intended to limit the scope of the disclosure. Indeed, the novel embodiments described herein may be embodied in a variety of other forms; omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A method for manufacturing a semiconductor device comprising:
    forming a first film on a substrate;
    forming a second film on the first film;
    forming a second recessed portion in the second film by anisotropic etching;
    forming a third film on a side surface of the second film in the second recessed portion;
    after forming the third film, processing at least one of the second film or third film in the second recessed portion by isotropic etching; and
    processing the first film from the second recessed portion to form a first recessed portion in the first film, after processing the second film or third film through the isotropic etching.

2. The method for manufacturing a semiconductor device according to claim 1, further comprising:
    forming a fourth film on a side surface of the second film or third film in the second recessed portion, after processing the second film or third film, and before forming the first recessed portion; and
    processing the second film, third film, or fourth film in the second recessed portion, after processing the second film or third film, and before forming the first recessed portion.

3. The method for manufacturing a semiconductor device according to claim 1,
    wherein the second film or third film is processed by etching with an etching selection ratio of the third film to the second film being greater than 1.

4. The method for manufacturing a semiconductor device according to claim 3,
wherein the second film or third film is processed by etching with the etching selection ratio of the third film to the second film being greater than 1, and then the second film or third film is etched with an etching selection ratio of the second film to the third film being greater than 1.

5. The method for manufacturing a semiconductor device according to claim 1,
wherein the second film or third film is processed by etching with an etching selection ratio of the second film to the third film being greater than 1.

6. The method for manufacturing a semiconductor device according to claim 1,
wherein the side surface of the second film includes a first portion and a second portion located below the first portion,
the third film is formed at the first and second portions on the side surface of the second film, and
the third film remains on the second portion while being processed and the third film is processed to be removed from the first portion until the second film is exposed.

7. The method for manufacturing a semiconductor device according to claim 6,
wherein the side surface of the second film includes a third portion located between the first portion and the second portion, and
the second film is processed to form a step in the third portion.

8. The method for manufacturing a semiconductor device according to claim 1,
wherein the side surface of the second film includes a first portion and a second portion located below the first portion, and
the third film is formed only at the first portion out of the first and second portions on the side surface of the second film.

9. The method for manufacturing a semiconductor device according to claim 1,
wherein the first film alternately includes a plurality of first layers and a plurality of second layers.

10. The method for manufacturing a semiconductor device according to claim 1, further comprising:
forming a charge storage layer and a semiconductor layer in the first recessed portion.

11. The method for manufacturing a semiconductor device according to claim 1,
wherein the second film contains carbon.

12. The method for manufacturing a semiconductor device according to claim 1,
wherein the third film contains silicon.

13. The method for manufacturing a semiconductor device according to claim 1, wherein
a depth of the first recessed portion is greater than a size of a diameter of the first recessed portion.

14. A method for manufacturing a semiconductor device comprising:
forming a first film on a substrate;
forming a second film on the first film;
forming a second recessed portion in the second film by anisotropic etching;
processing the first film from the second recessed portion to form a first recessed portion in the first film;
forming a third film on a side surface of the first film or second film; and
after forming the third film, processing the first film, second film, and third film in the first and second recessed portions, wherein at least one of the second film or the third film in the second recessed portion is processed by isotropic etching.

15. The method for manufacturing a semiconductor device according to claim 14, further comprising:
forming a fourth film on a side surface of the first film, second film, or third film in the first and second recessed portions after processing the first film, second film, and the third film; and
processing the first film, second film, third film, or fourth film in the first and second recessed portions.

16. The method for manufacturing a semiconductor device according to claim 14,
wherein the first film, second film, or third film is etched with an etching selection ratio of the second film to the third film being greater than 1.

17. The method for manufacturing a semiconductor device according to claim 14,
wherein side surfaces of the first film and second film include a first portion and a second portion located below the first portion, and
the third film is formed only at the first portion out of the first and second portions on the side surfaces of the first film and second film.

18. The method for manufacturing a semiconductor device according to claim 14, wherein:
after forming the third film, processing the first film by isotropic etching.

19. The method for manufacturing a semiconductor device according to claim 14, wherein
a depth of the first recessed portion is greater than a size of a diameter of the first recessed portion.

20. A method for processing a film comprising:
forming a first film;
forming a second film on the first film;
forming a second recessed portion in the second film by anisotropic etching;
forming a third film on a side surface of the second film in the second recessed portion;
after forming the third film, processing at least one of the second film or third film in the second recessed portion by isotropic etching; and
processing the first film from the second recessed portion to form a first recessed portion in the first film, after processing the second film or third film through the isotropic etching.

21. The method for processing a film according to claim 20, further comprising:
forming a fourth film on a side surface of the second film or third film in the second recessed portion after processing the second film or third film and before forming the first recessed portion; and
processing the second film, third film, or fourth film in the second recessed portion, after processing the second film or third film, and before forming the first recessed portion.

* * * * *